(12) United States Patent  
Rivero et al.

(10) Patent No.: US 8,298,848 B2  
(45) Date of Patent: Oct. 30, 2012

(54) METHOD OF GENERATING ELECTRICAL ENERGY IN AN INTEGRATED CIRCUIT DURING THE OPERATION OF THE LATTER, CORRESPONDING INTEGRATED CIRCUIT AND METHOD OF FABRICATION

(75) Inventors: Christian Rivero, Luynes (FR); Pascal Fornara, Pourrières (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 97 days.

(21) Appl. No.: 12/793,204

(22) Filed: Jun. 3, 2010

(65) Prior Publication Data

US 2010/0308898 A1 Dec. 9, 2010

(30) Foreign Application Priority Data

Jun. 4, 2009 (FX) .................................. 09 53703

(51) Int. Cl.
 *H01L 21/768* (2006.01)

(52) U.S. Cl. .................................. 438/54; 257/E21.585
(58) Field of Classification Search .................. None
 See application file for complete search history.

(56) References Cited

U.S. PATENT DOCUMENTS

| 2002/0063327 A1 | 5/2002 | Chu et al. ..................... 257/706 |
| 2006/0151021 A1* | 7/2006 | Stark ............................. 136/205 |
| 2009/0000652 A1* | 1/2009 | von Windheim et al. ..... 136/230 |

FOREIGN PATENT DOCUMENTS

| GB | 2364439 | 1/2002 |
| WO | WO2007004137 | 1/2007 |

* cited by examiner

*Primary Examiner* — Charles Garber  
*Assistant Examiner* — Seahvosh Nikmanesh  
(74) *Attorney, Agent, or Firm* — Allen, Dyer, Doppelt, Milbrath & Gilchrist, P.A.

(57) ABSTRACT

An integrated circuit may include a region containing a thermoelectric material and be configured to be subjected to a temperature gradient resulting from a flow of an electric current in a part of the integrated circuit during its operation, and an electrically conducting output coupled to the region for delivering the electrical energy produced by thermoelectric material.

14 Claims, 7 Drawing Sheets

METHOD OF GENERATING ELECTRICAL ENERGY IN AN INTEGRATED CIRCUIT DURING THE OPERATION OF THE LATTER, CORRESPONDING INTEGRATED CIRCUIT AND METHOD OF FABRICATION

FIELD OF THE INVENTION

The present embodiments relate to integrated circuits, and more particularly, to the generation of electrical energy in an integrated circuit other than the energy produced by a conventional power supply, such as, for example, a battery.

BACKGROUND OF THE INVENTION

Integrated circuits typically comprise a large number of active devices, for example, transistors. Indeed, it is not uncommon for the typical integrated circuit to have several million active devices. As the density of the integrated circuit has increased, thermal power dissipation, the result of the operation of the integrated circuit, has increased. Typically, the integrated circuit may be paired with a cooling device to compensate for this thermal heat dissipation, for example, a fan and heat sink may be attached to the integrated circuit to remove the heat from the integrated circuit. Nevertheless, this energy is ultimately wasted.

SUMMARY OF THE INVENTION

According to an embodiment, there is a method and an integrated circuit making it possible to recover electrical energy on the basis of the inherent operation of the integrated circuit, in order optionally to store this electrical energy so as to be able, for example, to power a specific part of the integrated circuit and/or recharge a battery. It then becomes possible to considerably increase the lifetime of the battery and/or to decrease the size of the latter.

According to one aspect, a method of generating energy in an integrated circuit may comprise a production of at least one temperature gradient in at least one region of the integrated circuit resulting from a flow of an electric current in at least one part of the integrated circuit during its operation, and a production of electrical energy on the basis of at least one thermoelectric material contained in the region or regions subjected to the temperature gradient or gradients.

It has been observed that during the operation of at least a part of the integrated circuit of the present embodiment, temperature gradients occurred in certain regions of the integrated circuit, in particular between the various electrical interconnection levels. The gradients may result from the flow of electric currents, for example, electrical pulses caused by, for example, the toggling of logic gates, of registers, of flip-flops, the switching of transistors, etc. And, depending on the interconnection of these various components, the propagation of these electrical pulses causes temperature gradients at certain moments and in certain regions of the integrated circuit.

Thermoelectric material may consequently make it possible to produce electrical energy, and more precisely an electric current, on the basis of thermal gradient to which it is subjected. It should be noted here that the method implemented does not use any specific heating or cooling component, the only function of which would be to cause the temperature gradient. On the contrary, the actual elements of the integrated circuit, such as, for example, the interconnection network, are used for the production of thermal gradient or gradients.

Typically, an integrated circuit comprises a part commonly designated by the person skilled in the art by the expression "front-end-of-line" (FEOL) surmounted by a second part commonly designated by the person skilled in the art by the expression "back-end-of-line" (BEOL). The part FEOL is in fact the first fabricated part of the integrated circuit, in which are situated the customary active components such as, for example, transistors, resistors, etc. The part FEOL generally encompasses all the various elements of the integrated circuit as far as the first metallization layer.

The upper part of the integrated circuit, namely the part BEOL, is that part of the integrated circuit in which the active components are interconnected by way of an interconnection network comprising metallization levels forming tracks or interconnection lines, and vias. This part BEOL generally begins with the first metallization level and it also includes the vias, the insulating layers as well as the contact pads disposed on the upper part of the integrated circuit.

Although the thermoelectric region or regions can be disposed in any part of the integrated circuit which is subject to a temperature gradient, it is particularly advantageous and simple to house thermoelectric material or materials in one or more regions made in the vicinity of one or more interconnection network portions, that is to say in the part BEOL of the integrated circuit. Indeed, it has been observed that the flow of the electric current in at least one part of the interconnection network during the operation of at least one part of the integrated circuit made it possible to produce readily usable temperature gradients.

The location of the temperature gradients in the integrated circuit depends in particular on the internal characteristics of the integrated circuit and its envisioned manner of operation, and in particular on the type of active components, the manner in which they are interconnected, and the manner in which they are used and implemented during the operation of the integrated circuit. This location of the temperature gradients, in particular within the interconnection network, can readily be effected, for example, by simulation on the basis of one or more simulations of the operation of the integrated circuit in envisioned operating situations.

And once this location of the temperature gradients has been performed, it is then easy to locate the regions intended to contain one or more thermoelectric materials. When the interconnection network comprises several interconnection levels, this generally being the case, it is possible to make at least one of the thermoelectric regions on and between different interconnection levels. It is also possible to make at least one of the thermoelectric regions on one and the same interconnection level.

According to an embodiment, it is also possible to make at least one of the thermoelectric regions in such a way that it neighbors at least two zones of different thermal diffusivities of an electrically insulating shroud (for example, an interlevel dielectric) of a portion of the interconnection network. It is possible to make, for example, an air pocket in this insulating shroud, commonly designated by the person skilled in the art by the expression "air gap," thereby making it possible to create a zone of low thermal diffusivity.

The energy produced by thermoelectric material can be used for various purposes. It is, for example, possible to store this energy in a storage means or a storage device, for example, a capacitor, made in the integrated circuit. This capacitor could be a metal-metal capacitor, for example, made in the part BEOL, or else a capacitor made in the part FEOL.

According to another aspect, there is an integrated circuit that may comprise at least one region containing at least one thermoelectric material and configured to be subjected to at least one temperature gradient resulting from a flow of an electric current in at least one part of the integrated circuit during its operation, and electrically conducting output means or an electrically conductive output coupled to the region or regions for delivering the electrical energy produced by thermoelectric material or materials.

According to an embodiment, the integrated circuit may comprise active components and an electrically conducting interconnection network between the active components. The region or regions containing at least one thermoelectric material and configured to be subjected to at least one temperature gradient are situated in the vicinity of one or more portions of the interconnection network.

According to an embodiment, the interconnection network may comprise several interconnection levels, and at least one of the regions extends over and between different interconnection levels. According to an embodiment, the interconnection network may comprise several interconnection levels, and at least one of the regions extends over one and the same interconnection level.

According to an embodiment, at least one of the regions may neighbor at least two zones of different thermal diffusivities of an electrically insulating shroud of a portion of the interconnection network. One of the two zones can comprise an air pocket. According to an embodiment, at least one of the regions may extend between at least one of the parts of the interconnection lines.

According to an embodiment, the integrated circuit may further comprise electrical energy storage means or an electrical energy storage device electrically coupled to the electrically conducting output. According to another aspect, there is a method of fabricating an integrated circuit that may comprise a making of at least one region containing at least one thermoelectric material and configured to be subjected to at least one temperature gradient resulting from a flow of an electric current in at least one part of the integrated circuit during its operation, and a making of electrically conducting output means or an electrically conducting output coupled to the region or regions for delivering the electrical energy produced by thermoelectric material or materials.

According to an embodiment in which there is envisioned a making of an active part of the integrated circuit and a making of an interconnection network above the active part, the making of the thermoelectric region or regions as well as the making of the electrically conducting output may be performed during the making of the interconnection network. According to an embodiment, the making of the region or regions may comprise operations of etching between interconnection lines of the interconnection network that are situated on one or more interconnection levels, so as to create trenches, and a filling of these trenches with at least one thermoelectric material.

According to an embodiment, the making of at least one region may comprise a making of at least one via between thermoelectric trenches situated on different interconnection levels, and a filling of the via or vias with a thermoelectric material. According to an embodiment, there may be a provision for making an air pocket in the vicinity of a part of at least one region filled with a thermoelectric material. According to an embodiment, there may be a provision for making an energy storage means or an energy storage device coupled to the electrical output.

BRIEF DESCRIPTION OF THE DRAWINGS

Other advantages and characteristics of the present embodiments may be apparent on examining the detailed description of wholly non-limiting modes of implementation and embodiment and the appended drawings, in which.

DETAILED DESCRIPTION OF THE PREFERRED EMBODIMENTS

Figure 1:
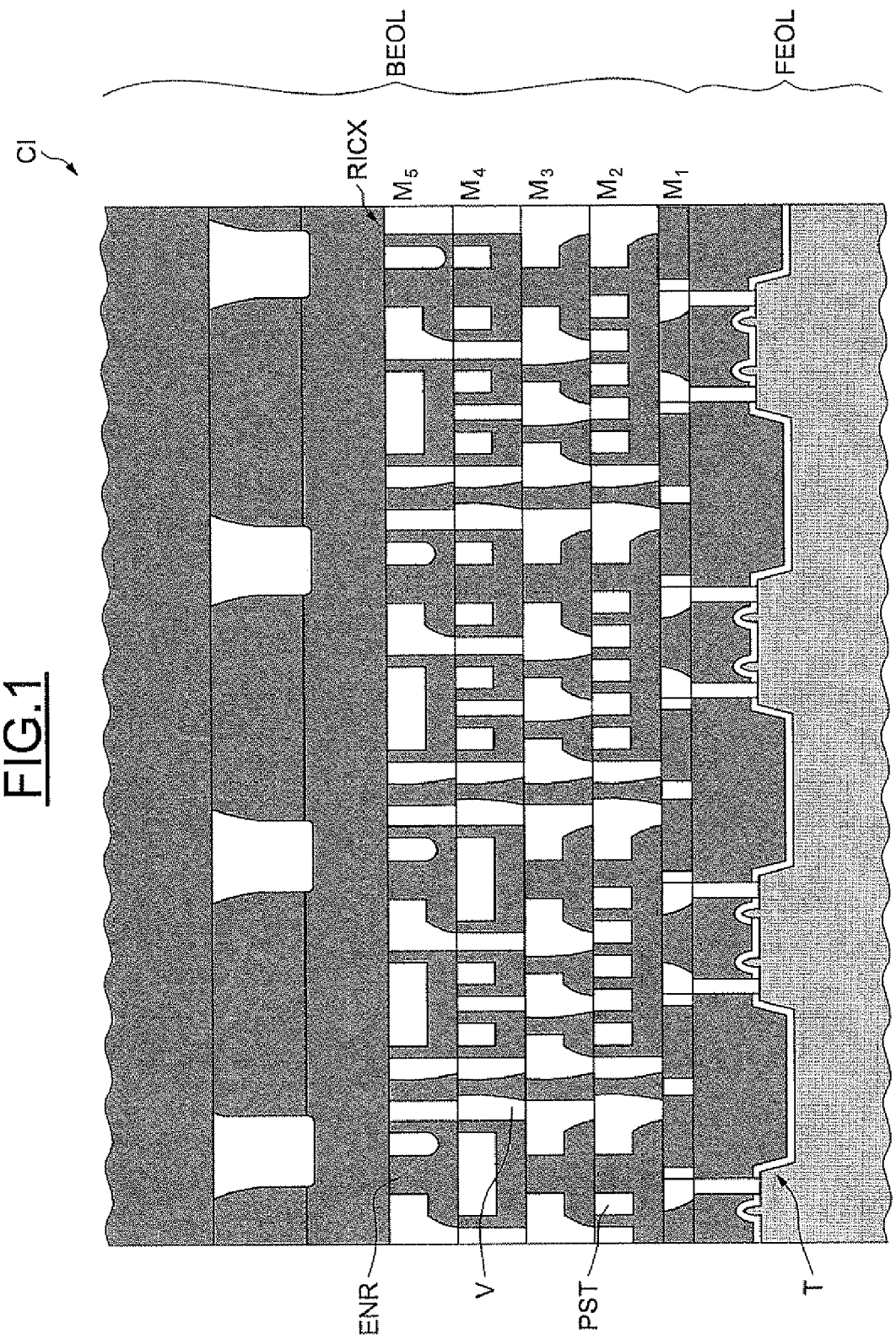
FIG. 1 is a schematic diagram of an exemplary structure of an integrated circuit, according to the present embodiments.

In FIG. 1, the reference CI designates an integrated circuit of conventional structure comprising an active part, comprising active components, for example, a transistor T. This active part is commonly designated by the person skilled in the art by the expression "front-end-of-line" (FEOL). This active part is surmounted by an interconnection network RICX intended to interconnect the various active components of the integrated circuit with one another and with contact pads situated on the upper part of the integrated circuit.

This interconnection network RICK comprises in a conventional manner an assembly of electrically conducting tracks, for example, copper or aluminum, referenced PST, distributed over several metallization levels $M_i$, five of which are represented in FIG. 1. The interconnection network also comprises vias V, which are electrically conducting orifices linking certain tracks of one metallization level to certain tracks of the adjacent metallization level. Finally, the assembly of the tracks and vias are mutually electrically insulated by an insulating shroud ENR or interlayer dielectric ILD. Such a dielectric can be, for example, silicon dioxide.

Figure 2:
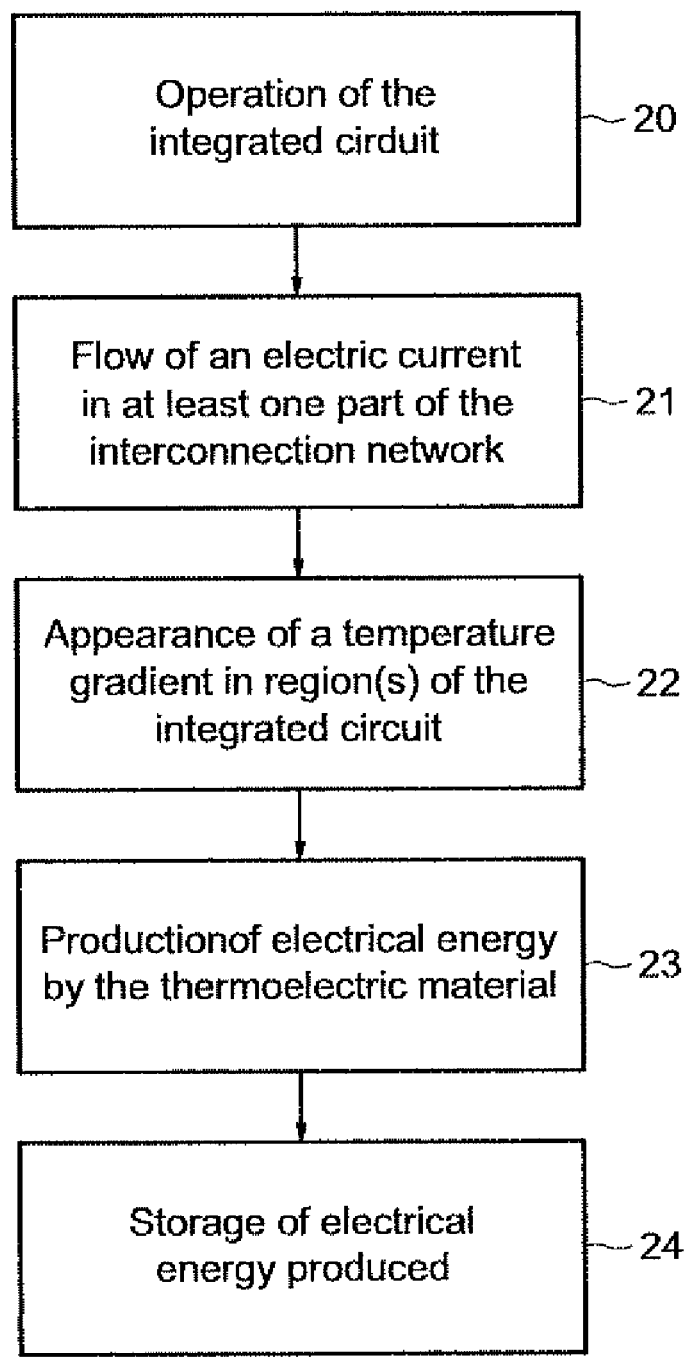
FIG. 2 is a flowchart of a mode of implementing a method, according to the present embodiments.

During the operation of this integrated circuit (step 20, FIG. 2), a flow of an electric current occurs (step 21) in at least one part of the interconnection network RICX. This flow of the electric current at a given instant results, for example, from the toggling of logic flip-flops, transistor switching, etc. This electric current propagates in a part of the interconnection network. At another instant, other components can be involved, also causing the flow of an electric current flowing in another part of the interconnection network, or indeed partially in the same part as previously.

The flow of these currents causes (step 22) the appearance of a temperature gradient in at least one region of the integrated circuit, for example, between the various electrical interconnection levels M1-M5. Hence, there is provision to dispose at least one thermoelectric material, and in practice one and the same thermoelectric material, in one or indeed several of these regions, which are subjected to such a temperature gradient.

Thermoelectric material, subjected to a temperature gradient, then produces (step 23) electrical energy (an electric current), which, as may be seen in greater detail hereinafter, may be able to be removed to, for example, a storage device for storing the electrical energy produced (step 24). It should be noted forthwith that this or these temperature gradients, which occur in certain parts of the interconnection network, result solely from the inherent operation of the integrated circuit. There is no provision here to insert into the integrated circuit a specific element making it possible to create a temperature gradient, for example, an element capable of cooling a part of the integrated circuit or an element capable of heating by itself a part of the integrated circuit.

Likewise, thermoelectric material does not participate in the operation of the integrated circuit. It serves here only to utilize the temperature gradient caused by the operation of the integrated circuit so as to produce electrical energy other than that provided by the integrated circuit's own inherent power supply.

In practice, according to an embodiment, the regions in which thermoelectric material may be deposited neighbor the interconnection lines PST, which are heat sources. Any thermoelectric material is suitable for producing the energy resulting from the temperature gradient to which the material is subjected. It is possible to cite in particular bismuth telluride ($Bi_2Te_3$) or alloys of germanium silicon or a material from the family of the skutterudites. The latter compounds have a cubic structure formed of a lattice of type $MX3$ (with M designating a transition metal and X possibly being arsenic, phosphorus or antimony) with at the center of this lattice a large cage into which heavy atoms, in particular rare earths, can be inserted.

Figure 3:
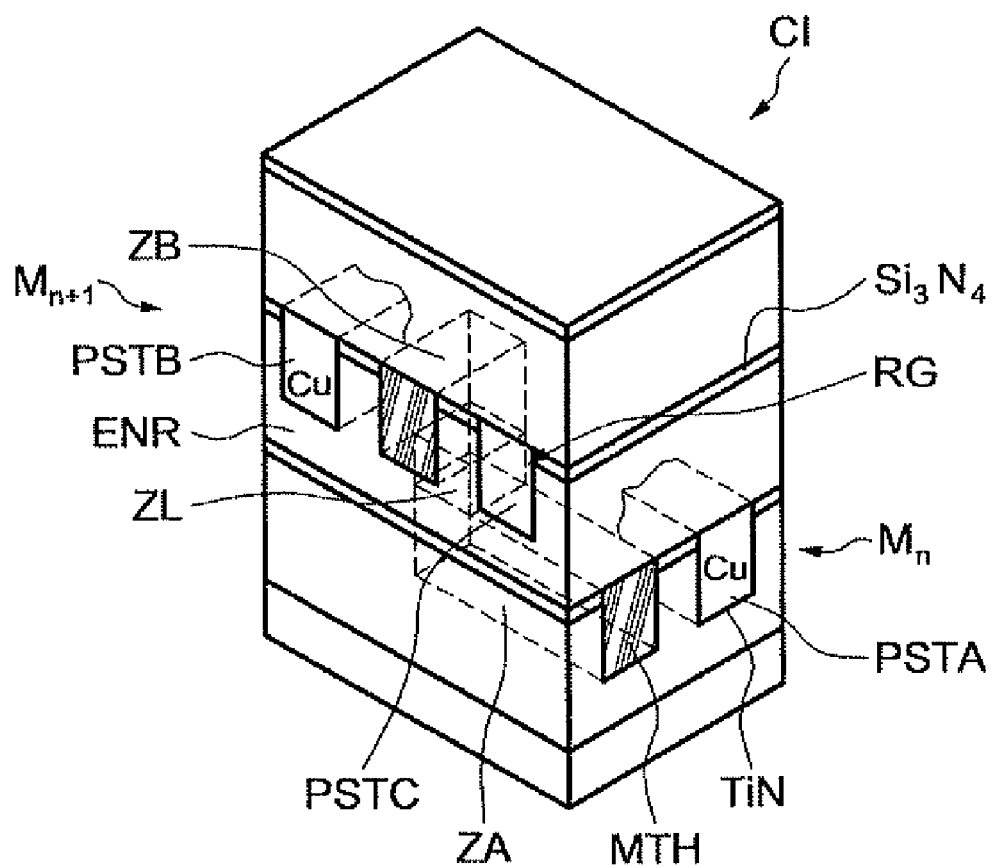
FIG. 3 is a perspective view of an exemplary embodiment of an integrated circuit, according to the present embodiments.

A portion of the interconnection network of the integrated circuit CI comprising three tracks or interconnection lines PSTA, PSTB and PSTC has been represented in FIG. 3. The track PSTA is situated at metallization level n, while the tracks PSTB and PSTC are situated at metallization level n+1. It should be noted here that the track PSTA and the track PSTB can be either two totally independent interconnection lines, or together linked to somewhere else in the integrated circuit by a via.

It is assumed that when the integrated circuit is operating, the line PSTA forms a first heat source while the line PSTB forms a second heat source and that there exists a temperature gradient between these two lines, for example, of the order of about ten degrees C°. A thermoelectric material MTH lying in a region RG possessing two zones ZA and ZB linked by a linking part or via ZL is therefore placed in the vicinity of this portion of the interconnection network formed of the two lines PSTA and PSTB. The zone ZA is situated in the vicinity of the track PSTA while the zone ZB is situated in the vicinity of the track PSTB. Thermoelectric material MTH disposed in this region is consequently subjected to the temperature gradient $\Delta T$ that appears at the level of the interconnection lines PSTA and PSTB. Through the presence of this temperature gradient, thermoelectric material MTH may therefore produce electrical energy.

Figure 4:
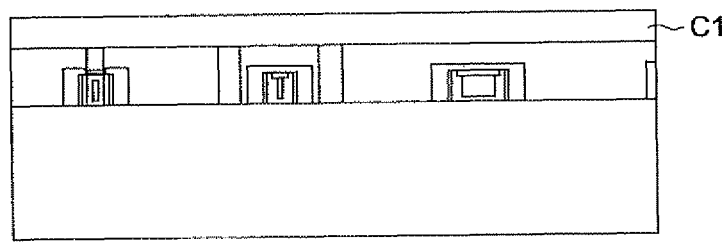
FIGS. 4 to 8 are side views of an exemplary embodiment of thermoelectric regions in an integrated circuit, according to the present embodiments.
Figure 5:
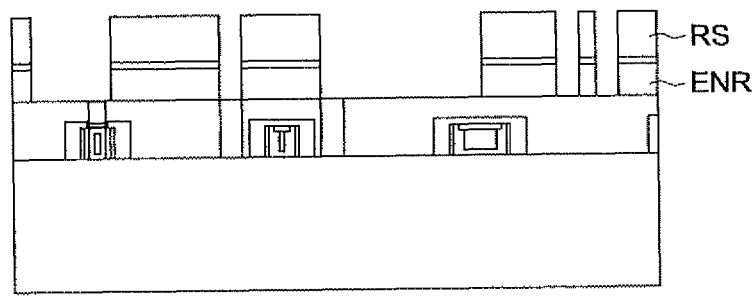

Reference is now made more particularly to FIGS. 4 to 8 to describe in particular an example of making a region containing a thermoelectric material MTH. In FIG. 4, three transistors T made in the part FEOL of the integrated circuit have been illustrated by way of example. The metal level M1 is then made in a conventional manner. More precisely, as illustrated in FIG. 4, an insulating layer C1, for example, silicon dioxide, is deposited and may be intended to form the shroud ENR between the future tracks and vias.

Next, after having deposited a resin layer RS and performed a delimitation, by photolithography and irradiation of the resin, of the locations of the future metal tracks PST, a conventional etching of the layer C1 is carried out through the resin mask RS so as to form cavities CV.

Figure 6:
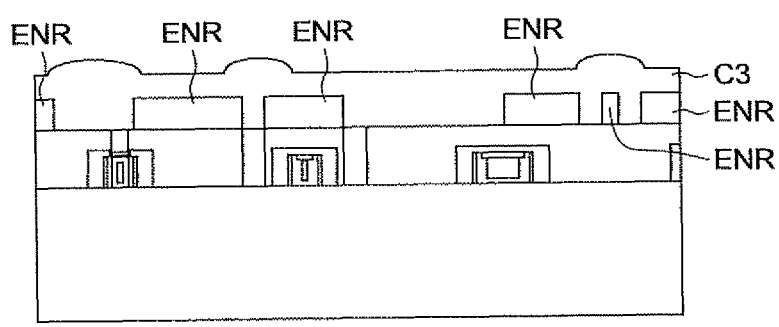
Figure 7:
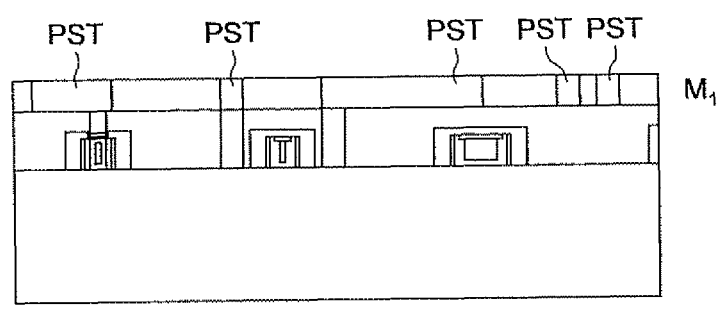
Figure 8:
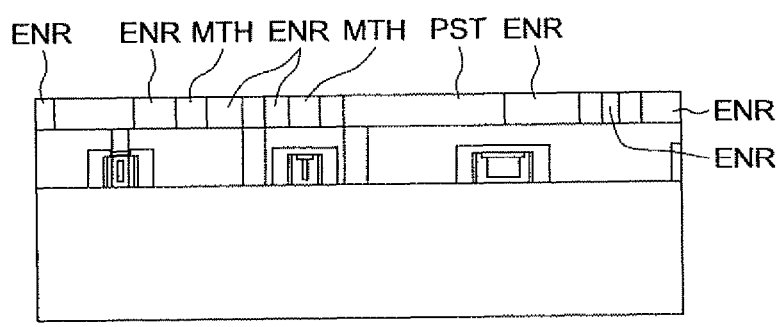

Next, a metal layer C3 comprising, for example, copper, is deposited so as to fill the cavities CV (FIG. 6). Next, after mechanical-chemical polishing, the configuration illustrated in FIG. 7 is obtained with the making of the metal level M1 comprising the metal tracks PST shrouded by the insulating shroud ENR.

The making of the regions RG or trenches containing the metallic material MTH at the metallization level M1 can be performed by steps analogous to those just described. More precisely, in such an eventuality, to define the locations of the various trenches, a new step of photolithography and etching of the material of the layer C1 disposed between the tracks PST is also carried out so as to form cavities intended to receive thermoelectric material MTH.

Next, the deposition of a layer of this thermoelectric material is carried out so as to fill the cavities and a mechanical-chemical polishing is carried out so as to obtain the cavities filled with the material MTH. In the example just described, the metal tracks were formed by etching the dielectric material and filling with the metal. As a variant, these tracks could be formed by depositing a metal and then etching the metal, in particular when aluminum is used The same could be done to make the regions of thermoelectric material, namely formation of a layer of thermoelectric material and then etching of this material.

Such an approach can be envisioned, for example, when bismuth telluride is used. More precisely, the formation of a bismuth telluride layer can be performed by a conventional chemical vapor deposition or by a known technique of molecular epitaxy usually known to the person skilled in the art by the expression Molecular Beam Epitaxy (MBE). The patterns of thermoelectric material can then be defined in a conventional manner by photolithography followed by plasma etching. The metal tracks and thermoelectric material patterns are thereafter covered with an insulating shroud such as a dielectric material.

Figure 9:
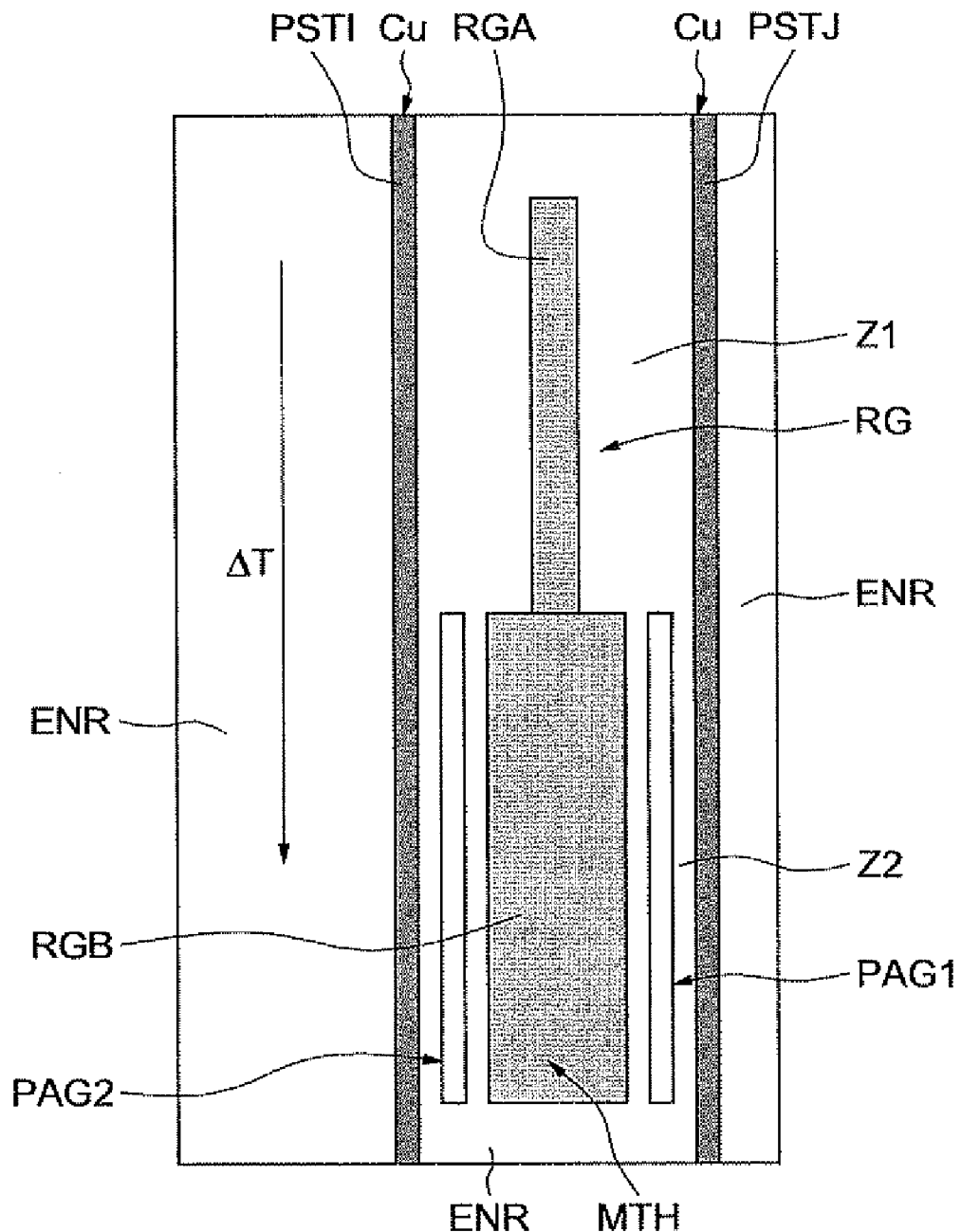
FIG. 9 is a schematic diagram of another embodiment of a part of an integrated circuit, according to the present embodiments.

Whereas FIG. 3 illustrates an exemplary embodiment of a thermoelectric region extending over several metallization levels, it is also possible to make these regions on one and the same metallization level as illustrated in FIG. 9. More precisely, in this figure, the references PSTI and PSTJ designate two metal tracks comprising, for example, copper, extending over one and the same metallization level and shrouded with an insulating shroud, such as a dielectric material. Two zones Z1 and Z2 exhibiting different thermal diffusivities are then made in this shroud, for example, between the two tracks PSTI and PSTJ.

In this regard, it is possible to make the air pockets PAG1, PAG2 in the vicinity of the metal tracks PSTI and PSTJ. Such air pockets as well as the making thereof are conventional and known to the person skilled in the art. Such an air pocket is also known by the expression "air gap."

Between the two tracks PSTI and PSTJ, a cavity or trench is made and may be filled with thermoelectric material MTH. Thermoelectric region RG then comprises a zone Z2 extending between the air pockets PAG1 and PAG2, and prolonged by a zone Z1 disposed between the tracks PSTI and PSTJ but not between the air pockets.

Thus, because of the low thermal diffusivity of the shroud ENR in the zone Z2, caused by the presence of the air pockets, a temperature gradient $\Delta T$ is created between the zone Z1 and the zone Z2 when an electric current flows in the tracks PSTI and PSTJ, thereby allowing thermoelectric material MTH to produce electrical energy.

Figure 10:
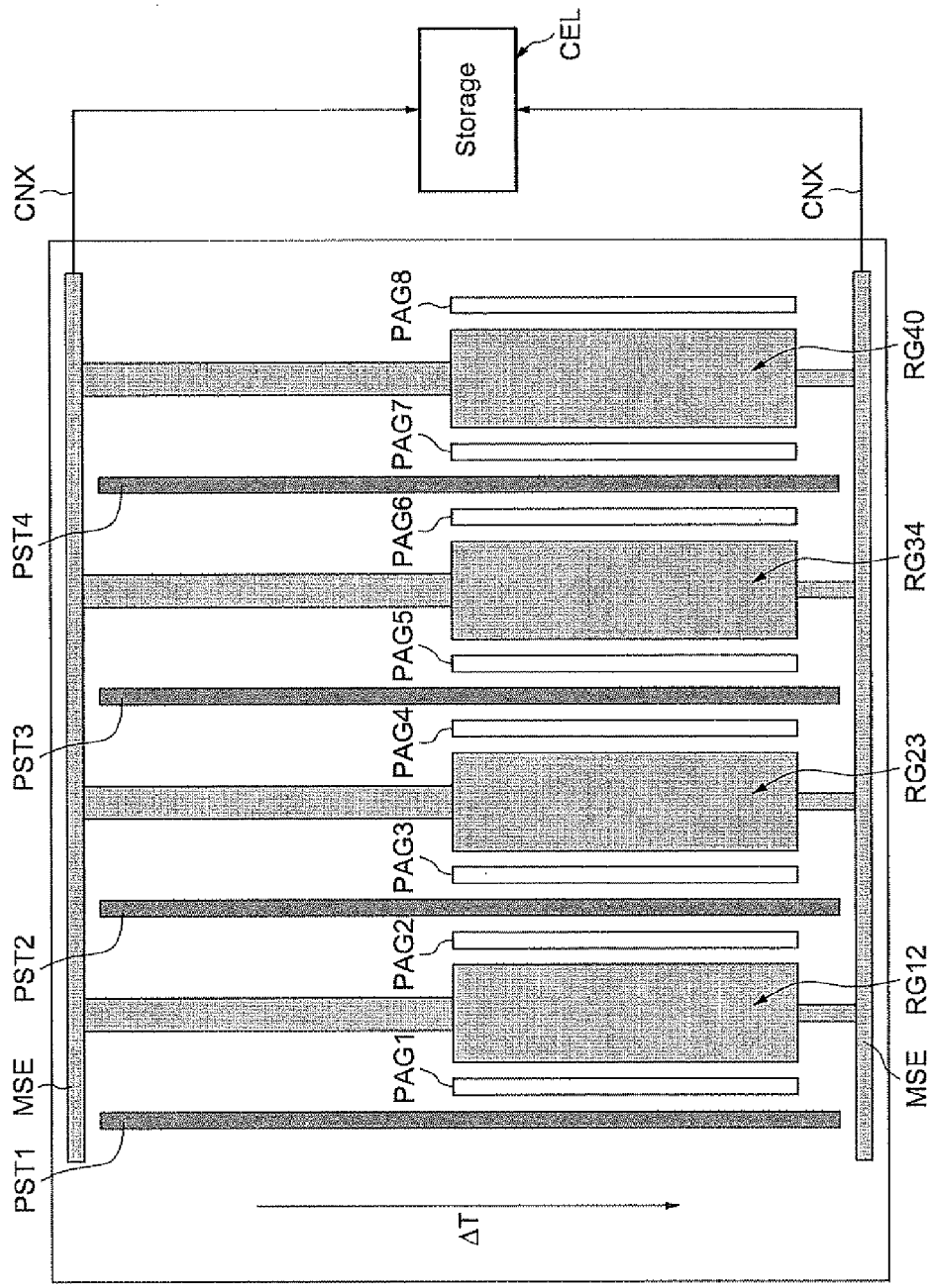
FIG. 10 is a schematic diagram of yet another embodiment of a part of an integrated circuit according to the present embodiments.

It is also possible, as illustrated in FIG. 10, to make in the integrated circuit a specific level in the interconnection network, for example, above the last metallization level, in such a way as to make a significant number of thermoelectric regions, or if the metallization levels are too dense to allow the insertion of thermoelectric trenches.

More precisely, in the example illustrated in FIG. 10, metal tracks PST1, PST2, PST3, PST4 linked of course to metal tracks of lower level by vias are made on this level specific. Next, between these metal tracks, thermoelectric regions RG12, RG23, RG34 and RGB40 are made, analogous, for example, to those that were described with reference to FIG. 9. Each of these regions partially neighbors air pockets PAG1, PAG2, PAG3, PAG4, PAG5, PAGE, PAG7, PAG8.

All these regions are consequently subjected to the temperature gradient ΔT when electric current flows in the tracks PST1, PST2, PST3 and PST4. Moreover, in this example, electrical output MSE formed of two bands of thermoelectric material respectively linked to the two ends of each of thermoelectric regions RG12, RG23, RG34 and RG40 are provided. These electrical outputs MSE are linked by an electrically conducting connection CNX, for example, a network of interconnection lines and vias, to a specific storage circuit CEL made, for example, in the part FEOL of the integrated circuit.

Figure 11:
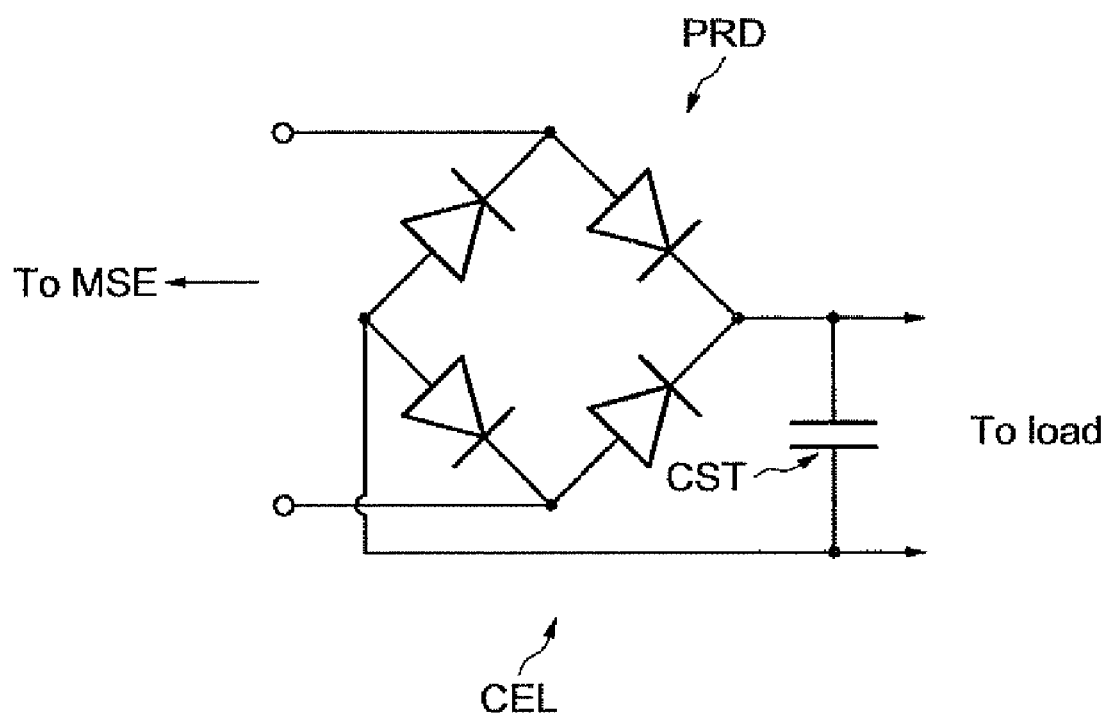
FIG. 11 illustrates an schematic circuit of an example of energy storage produced by an integrated circuit, according to the present embodiments.

FIG. 11 illustrates in a schematic manner an electrical scheme of such a circuit CEL making it possible to store the energy produced by thermoelectric regions during the operation of the integrated circuit. More precisely, in the example described here, which is wholly non-limiting, the circuit CEL comprises a rectifier bridge PRD based on diodes whose input zones are coupled to the output MSE by way of the connection CNX. The output of the rectifier bridge is connected to the two terminals of a storage capacitor CST, which may be able optionally to return the stored energy to a load of the integrated circuit.

The present embodiment is not limited to the modes of implementation and embodiment that have just been described but embraces all variants thereof.

Thus an integrated circuit can incorporate, in its upper part (BEOL) containing the interconnection network, dummy metallic lines (or "dummies" according to an expression well known to the person skilled in the art). These dummy lines serve to add density to the upper part of the integrated circuit when the interconnection network is not dense enough, so as to facilitate the method of fabrication and in particular the mechanical-chemical polishing steps. In such a case, it is possible to replace certain dummy lines or portions of dummy lines disposed in the vicinity of interconnection lines, with regions of thermoelectric material. One of thermoelectric regions MTH illustrated in FIG. 8 may, for example, have been made at a location initially envisioned for a dummy interconnection line. Such an embodiment is yet more readily compatible with a conventional process for making an integrated circuit.

That which is claimed is:

1. A method of generating energy in an integrated circuit, the method comprising:
   producing at least one temperature gradient in at least one region of the integrated circuit from a flow of a current in at least one part of the integrated circuit during operation thereof; and
   producing electrical energy using at least one thermoelectric material contained in the at least one region subjected to the at least one temperature gradient, the at least one region with the at least one thermoelectric material being in a location provided for at least one dummy interconnection line of the integrated circuit.

2. A method according to claim 1 wherein the integrated circuit comprises active components, and an electrically conductive interconnection network to interconnect the active components; wherein the production of the at least one temperature gradient is from a flow of the current in at least one part of the electrically conductive interconnection network during the operation of the integrated circuit; wherein the at least one region comprises a plurality thereof; and wherein the regions in the integrated circuit are adjacent the electrically conductive interconnection network for positioning the at least one thermoelectric material therein.

3. The method according to claim 2 wherein the electrically conductive interconnection network comprises a plurality of interconnection levels; and wherein the regions are on and between different interconnection levels.

4. The method according to claim 2 wherein the electrically conductive interconnection network comprises a plurality of interconnection levels; and wherein the regions are made on a same interconnection level.

5. The method according to claim 2 wherein at least one of the regions neighbors zones of differing thermal diffusivities of an electrically insulating shroud of a portion of the electrically conductive interconnection network.

6. The method according to claim 1 wherein the energy produced is stored in a storage device in the integrated circuit.

7. A method of making an integrated circuit comprising:
   forming at least one region in the integrated circuit for positioning at least one thermoelectric material, the at least one region to be subjected to at least one temperature gradient from a flow of a current in part of the integrated circuit during operation thereof, the at least one region with the at least one thermoelectric material being in a location provided for at least one dummy interconnection line of the integrated circuit; and
   forming an electrically conductive output coupled to the at least one region for delivering electrical energy produced by the at least one thermoelectric material.

8. The method according to claim 7 further comprising forming an active portion of the integrated circuit, and forming an interconnection portion on the active portion; wherein the at least one region comprises a plurality thereof; and wherein the forming of the regions and the forming of the electrically conductive output are performed during the making of the interconnection portion.

9. The method according to claim 7 wherein the forming of the at least one region comprises:
   etching between interconnection lines on at least one interconnection level to create trenches; and
   filling the trenches with the at least one thermoelectric material.

10. The method according to claim 9 wherein the forming of the at least one region comprises:
   forming at least one via between thermoelectric trenches situated on different interconnection levels; and
   filling of the at least one via with a thermoelectric material.

11. The method according to claim 7 wherein the forming of the at least one region comprises:
   etching between interconnection lines on at least one interconnection level to create trenches; and
   etching a previously formed thermoelectric material layer.

12. The method according to claim 7 further comprising forming air pockets adjacent the at least one region filled with a thermoelectric material.

13. The method according to claim 7 wherein the at least one region comprises a plurality thereof.

14. The method according to claim 7 further comprising providing an energy storage device to be coupled to the electrical conductive output.

* * * * *